(12) United States Patent
Asano

(10) Patent No.: US 7,274,720 B2
(45) Date of Patent: Sep. 25, 2007

(54) SEMICONDUCTOR LASER ELEMENT HAVING INGAAS COMPRESSIVE-STRAINED QUANTUM-WELL ACTIVE LAYER

(75) Inventor: Hideki Asano, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 376 days.

(21) Appl. No.: 11/077,126

(22) Filed: Mar. 11, 2005

(65) Prior Publication Data

US 2005/0201440 A1    Sep. 15, 2005

(30) Foreign Application Priority Data

Mar. 12, 2004   (JP)   ............................. 2004-070287

(51) Int. Cl.
  *H01S 5/00* (2006.01)
(52) U.S. Cl. ................................. 372/46.01; 372/43.01
(58) Field of Classification Search ............. 372/43.01, 372/75, 45.01
  See application file for complete search history.

(56) References Cited

U.S. PATENT DOCUMENTS 5,568,501 A * 10/1996 Otsuka et al. ........... 372/46.01
5,822,349 A * 10/1998 Takaoka et al. ......... 372/46.01
2002/0177250 A1 * 11/2002 Zhu et al. .................. 438/42

OTHER PUBLICATIONS

"Low-Cost Opto-Electronic Packaging Technology for High-Speed IT Appliances", Osamu Ibaragi, et al., Technical Research Report, vol. 102, No. 284, pp. 37-42, IEICE, 2002.

* cited by examiner

Primary Examiner—Minsun Oh Harvey
Assistant Examiner—Tuan N. Nguyen
(74) Attorney, Agent, or Firm—Sughrue Mion, PLLC

(57) ABSTRACT

In a semiconductor laser element, a lower cladding layer, a lower optical waveguide layer, an InGaAs compressive-strain quantum-well active layer, an upper optical waveguide layer, and an upper cladding layer are formed in this order in a stripe-shaped region on a substrate. A current-blocking layer is formed on both sides of the compressive-strain quantum-well active layer so that the compressive-strain quantum-well active layer is sandwiched between two portions of the current-blocking layer, and trenches extending along the direction of the laser resonator are formed through the current-blocking layer. Instead of providing the trenches, the widths of the layers formed above the substrate are reduced so as to form a ridge structure.

10 Claims, 5 Drawing Sheets

SEMICONDUCTOR LASER ELEMENT HAVING INGAAS COMPRESSIVE-STRAINED QUANTUM-WELL ACTIVE LAYER

BACKGROUND OF THE INVENTION

1. Field of the Invention

The present invention relates to a semiconductor laser element, and in particular to a semiconductor laser element which can be used as a light source in an information processing device.

2. Description of the Related Art

The personal computers have penetrated into offices and homes, and progressed so that the processing speeds of the current personal computers are comparable to the supercomputers of tens of years past. In particular, the increase in the processing speeds of the CPUs is remarkable, and the clock frequencies of some of the currently available CPUs exceed 3 GHz. It is considered that the clock frequencies of CPUs can be increased to about 10 GHz by using only the currently known techniques.

However, even when the processing speeds of the CPUs per se are increased, the substantial processing speeds of computers do not increase unless the data transfer rates between each CPU and other elements, such as memories and LSIs (large-scale integrated circuits) for image processing, increase. Therefore, an attempt to increase the data transfer rate by connecting a CPU and LSIs and memories with optical wiring has been made. For example, Osamu Ibaraki et al. ("Low-Cost Opto-Electronic Packaging Technology for High-Speed IT Appliances," Osamu Ibaragi, et al., Technical Research Report, Vol. 102, No. 284, pp. 37-42, IEICE, 2002) disclose a technique in which LSIs, driver/receiver ICs, submount substrates, surface-emitting semiconductor lasers, and photodetectors are three-dimensionally mounted, and through-holes are formed in the semiconductor lasers and the photodetectors, and arranged in proximity to optical waveguides so that the semiconductor lasers and the photodetectors are optically coupled.

The light sources used for optical transfer between LSIs are required to be arranged in proximity to the LSIs. Therefore, there is concern about the influence of the heat generated by the LSIs. For example, in the case of the Pentium, which is currently widely used as a CPU in a personal computer, it is said that the surface temperature of the package base reaches 70° C. during use. (Pentium is a registered trademark of Intel Corporation.) Therefore, the light sources used for optical transfer between LSIs are required to stably operate in a high temperature environment, and maintain their performance regardless of the ambient temperature.

Currently, the surface-emitting semiconductor lasers are the most promising device as light sources used for optical wiring connecting LSIs. However, the surface-emitting semiconductor lasers have structural constraints which increase resistance. Therefore, the surface-emitting semiconductor lasers per se generate great heat, and raise the ambient temperature, so that the optical output characteristics deteriorate. If such surface-emitting semiconductor lasers are arranged in proximity to the LSIs, the driving currents can vary with the ambient temperature. Further, the temperature rise can stop the oscillation of the semiconductor lasers, and make transmission of optical signals impossible.

On the other hand, use of the edge-emitting semiconductor lasers as light sources for optical wiring is currently being considered. Since the semiconductor lasers in the 0.6, 1.3, and 1.55 µm bands do not have satisfactory temperature characteristics, the 0.8 µm-band semiconductor lasers are considered as potential devices. However, the temperature characteristics of the 0.8 µm-band semiconductor lasers do not indicate that the 0.8 µm-band semiconductor lasers are suitable for use immediately under LSIs. Therefore, further improvement in the temperature characteristics of the 0.8 µm-band semiconductor lasers is required.

SUMMARY OF THE INVENTION

The present invention has been developed in view of the above circumstances.

The object of the present invention is to provide a semiconductor laser element which has improved temperature characteristics, and can realize a stable optical output with low operating current even in a high temperature environment at the temperature of about 100° C. as well as at room temperature.

In order to accomplish the aforementioned object, the first aspect of the present invention is provided. According to the first aspect of the present invention, there is provided a semiconductor laser element comprising: a substrate made of GaAs of a first conductive type; a lower cladding layer being formed above the substrate and made of a material of the first conductive type, and having a stripe shape with a width smaller than the width of the substrate; a lower optical waveguide layer being formed above the lower cladding layer and made of a material of an undoped type or the first conductive type, and having a stripe shape with a width smaller than the width of the substrate; at least one compressive-strain quantum-well active layer being formed above the lower optical waveguide layer and made of InGaAs, and having a stripe shape with a width smaller than the width of the substrate; an upper optical waveguide layer being formed above the at least one compressive-strain quantum-well active layer and made of a material of an undoped type or a second conductive type, and having a stripe shape with a width smaller than the width of the substrate; an upper cladding layer being formed above the upper optical waveguide layer and made of a material of the second conductive type, and having a stripe shape with a width smaller than the width of the substrate; a current-blocking layer formed on both sides of the at least one compressive-strain quantum-well active layer so that the at least one compressive-strain quantum-well active layer is sandwiched between two portions of the current-blocking layer; and trenches being formed through the current-blocking layer and extending along the direction of the laser resonator formed in the semiconductor laser element.

It is preferable that the semiconductor laser element according to the first aspect of the present invention further comprises at least one insulation layer which covers the surfaces of the trenches for preventing oxidation of the laser emission region. The insulation layer may be a thin layer covering the surfaces of the trenches, or the trenches may be filled with insulation layers.

In addition, in order to accomplish the aforementioned object, the second aspect of the present invention is also provided. According to the second aspect of the present invention, there is provided a semiconductor laser element comprising: a substrate made of GaAs of a first conductive type; and a ridge structure being arranged on the substrate, having a stripe shape, and extending along the direction of the laser resonator formed in the semiconductor laser element. In addition, the ridge structure includes: a lower cladding layer being formed above the substrate and made of a material of the first conductive type, and having a stripe shape with a width smaller than the width of the ridge structure; a lower optical waveguide layer being formed above the lower cladding layer and made of a material of an undoped type or the first conductive type, and having a stripe shape with a width smaller than the width of the ridge structure; at least one compressive-strain quantum-well active layer being formed above the lower optical waveguide layer and made of InGaAs, and having a stripe shape with a width smaller than the width of the ridge structure; an upper optical waveguide layer being formed above the at least one compressive-strain quantum-well active layer and made of a material of an undoped type or a second conductive type, and having a stripe shape with a width smaller than the width of the ridge structure; an upper cladding layer being formed above the upper optical waveguide layer and made of a material of the second conductive type, and having a stripe shape with a width smaller than the width of the substrate; and a current-blocking layer formed on both sides of the at least one compressive-strain quantum-well active layer so that the at least one compressive-strain quantum-well active layer is sandwiched between two portions of the current-blocking layer.

It is preferable that the semiconductor laser element according to the second aspect of the present invention further comprises at least one insulation layer which covers side surfaces of the ridge structure for preventing oxidation of the laser emission region. Specifically, the side surfaces are the two side surfaces of the ridge structure other than the forward and back end facets constituting the resonator. The at least one insulation layer may be realized by at least one thin layer covering the side surfaces, or insulation block layers between which the ridge structure is sandwiched.

In the semiconductor laser elements according to the first and second aspects of the present invention, the active layer is made of InGaAs, which realizes the oscillation wavelength of 0.9 to 1.2 micrometers. In addition, the active layer has a compressive-strain quantum-well structure. Therefore, the efficiency in carrier confinement is enhanced, and the threshold current can be maintained low. Further, since the current-blocking layer arranged on both sides of the active layer reduces leakage current, heat generation in the semiconductor laser elements is suppressed, and satisfactory temperature characteristics are obtained. Thus, satisfactory optical-output characteristics are stably obtained even in a high temperature environment, and power consumption can be suppressed.

In addition, it is preferable to arrange a carrier-confinement layer (which may be referred to as a carrier-blocking layer) between the active layer and each of the lower and upper optical waveguide layers. The efficiency in carrier confinement is remarkably increased by the provision of the carrier-confinement layer. At this time, when the current-blocking layer is made of AlGaInP, the effect of suppressing the leakage current is further enhanced, and therefore the characteristics of the semiconductor laser element are further improved.

Specifically, it is preferable to form each carrier-confinement layer of a material which has a bandgap greater than the bandgap of each of the lower optical waveguide layer and the upper optical waveguide layer, and smaller than the bandgap of each of the lower cladding layer and the upper cladding layer. In this case, the efficiency in carrier confinement is further enhanced.

Further, since the semiconductor laser elements according to the first and second aspects of the present invention have a buried structure in which the current-blocking layer is arranged on both sides of the active layer, the leakage current is reduced. Preferably, the current-blocking layer is constituted by a first layer formed adjacent to the at least one compressive-strain quantum-well active layer and made of $(Al_xGa_{1-x})_{0.5}In_{0.5}P$ ($0 \leq x \leq 1$) of the second conductive type, and a second layer formed above the first layer and made of $(Al_xGa_{1-x})_{0.5}In_{0.5}P$ ($0 \leq x \leq 1$) of the first conductive type. In this case, the leakage current can be greatly reduced.

Furthermore, in the semiconductor laser element according to the first aspect of the present invention, the trenches formed through the current-blocking layer on both sides of the active layer suppress the parasitic capacitances which occur at the interfaces between layers. On the other hand, in the semiconductor laser element according to the second aspect of the present invention, the parasitic capacitances which occur at the interfaces between layers are suppressed by arranging the InGaAs compressive-strain quantum-well active layer and the current-blocking layer in the ridge structure having a stripe shape and extending in the direction of the laser resonator. Therefore, either of the semiconductor laser elements according to the first and second aspects of the present invention exhibits satisfactory response characteristics.

Moreover, the semiconductor laser elements according to the first and second aspects of the present invention may comprise: a first multilayer film formed of a dielectric material so as to cover a first end facet of the semiconductor laser element through which laser light is emitted, and realize a first reflectance Rf at the first end facet; and a second multilayer film formed of a dielectric material so as to cover a second end facet of the semiconductor laser element opposite to the first end facet, and realize a second reflectance Rr at the second end facet. Preferably, the resonator length Lc of the semiconductor laser element and the first and second reflectances Rf and Rr satisfy the conditions, $$100 \ \mu m \leq Lc \leq 350 \ \mu m, \text{ and}$$

$$Rf \times Rr \geq 0.45.$$

When the above conditions are satisfied, the semiconductor laser elements can be driven with low driving current and exhibit superior temperature characteristics.

DESCRIPTION OF PREFERRED EMBODIMENTS

Embodiments of the present invention are explained in detail below with reference to drawings.

First Embodiment

Figure 1:
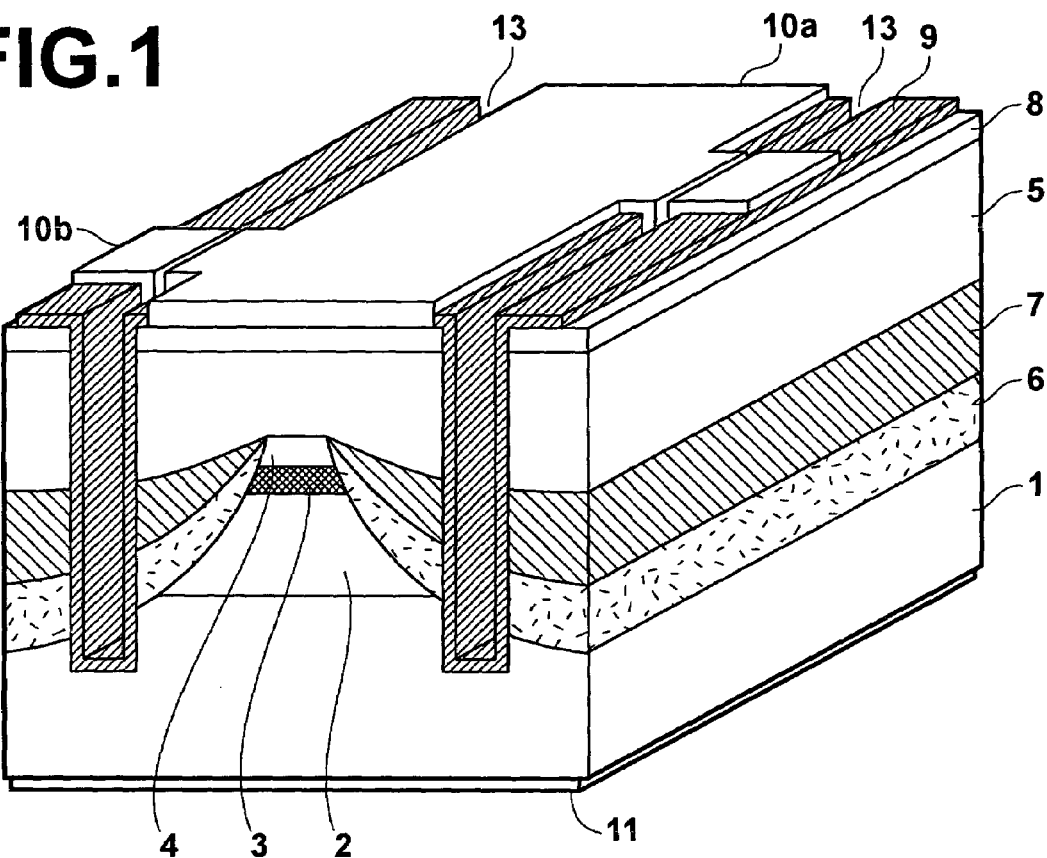
FIG. 1 is a schematic perspective view of a semiconductor laser element according to a first embodiment of the present invention.

FIG. 1 is a schematic perspective view of the semiconductor laser element according to the first embodiment of the present invention.

As illustrated in FIG. 1, the semiconductor laser element according to the present embodiment contains a stripe-shaped, layered structure in which an n-type $In_{0.49}Ga_{0.51}P$ lower cladding layer 2 having a thickness of 2.0 micrometers and being doped with impurity of $1\times10^{18}$ $cm^{-3}$, a light-emission layer 3 having a thickness of about 100 nm, a p-type $In_{0.49}Ga_{0.51}P$ first upper cladding layer 4 having a thickness of 1.0 micrometers and being doped with impurity of $1\times10^{18}$ $cm^{-3}$, and a p-type GaAs cap layer (not shown) having a thickness of 10 nm and being doped with impurity of $1\times10^{18}$ $cm^{-3}$ are formed in this order on an n-type GaAs substrate 1. As illustrated in FIG. 1, the stripe widths of the n-type $In_{0.49}Ga_{0.51}P$ lower cladding layer 2, the light-emission layer 3, the p-type $In_{0.49}Ga_{0.51}P$ first upper cladding layer 4, and the p-type GaAs cap layer are smaller than the stripe width of the n-type GaAs substrate 1. In this example, the stripe width of the light-emission layer 3 is about 2 micrometers.

Figure 2:
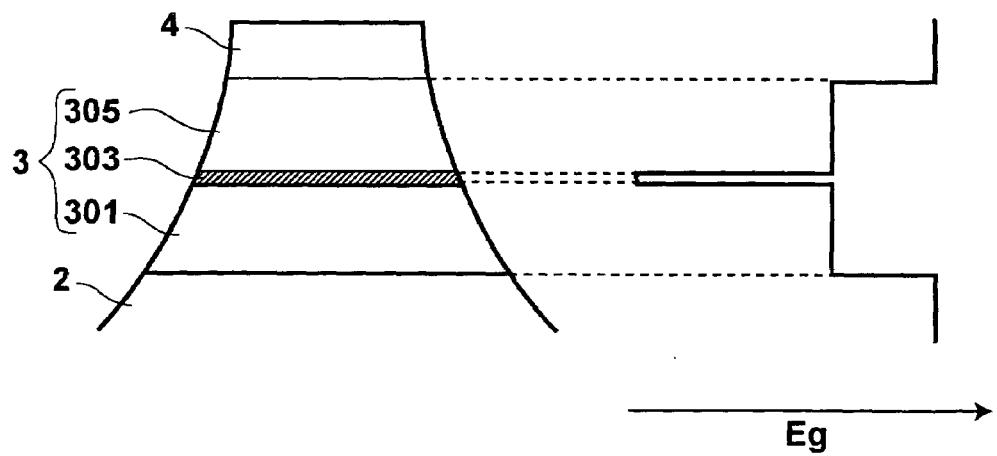
FIG. 2 is a diagram indicating details of the structure of an emission layer in the semiconductor laser element according to the first embodiment and the bandgaps in the respective layers of the emission layer.

FIG. 2 shows details of the structure of an emission layer 3 in the semiconductor laser element according to the first embodiment (in the left half of FIG. 2) and the bandgaps in the respective layers of the emission layer 3 (in the right half of FIG. 2). As illustrated in FIG. 2, the light-emission layer 3 has a structure in which an n-type or i-type InGaAsP lower optical waveguide layer 301 having a thickness of 50 nm, an i-type $In_{0.2}Ga_{0.8}As$ quantum-well active layer 303 having a thickness of 7 nm, and a p-type or i-type InGaAsP upper optical waveguide layer 305 having a thickness of 50 nm and a bandgap Eg of 1.60 eV are formed in this order. The strain and thickness of the i-type $In_{0.2}Ga_{0.8}As$ quantum-well active layer 303 are controlled so that the laser oscillation wavelength is 0.98 micrometers.

In addition, as illustrated in FIG. 1, a p-type AlGaInP buried layer 6 having a thickness of 0.6 micrometers and being doped with impurity of $1\times10^{18}$ $cm^{-3}$ is arranged on both sides of the layered structure of the n-type $In_{0.49}Ga_{0.51}P$ lower cladding layer 2, the light-emission layer 3, and the p-type $In_{0.49}Ga_{0.51}P$ first upper cladding layer 4 so that the layered structure of the n-type $In_{0.49}Ga_{0.51}P$ lower cladding layer 2, the light-emission layer 3, and the p-type $In_{0.49}Ga_{0.51}P$ first upper cladding layer 4 are sandwiched by two portions of the p-type AlGaInP buried layer 6. Further, an n-type AlGaInP current-blocking layer 7 having a thickness of 0.6 micrometers and being doped with impurity of $1\times10^{18}$ $cm^{-3}$ is formed on the p-type AlGaInP buried layer 6.

Furthermore, a p-type InGaP second upper cladding layer 5 having a thickness of 1.0 micrometers and being doped with impurity of $1\times10^{18}$ $cm^{-3}$ is formed so as to cover the p-type $In_{0.49}Ga_{0.51}P$ first upper cladding layer 4 and the n-type AlGaInP current-blocking layer 7, and a p-type GaAs contact layer 8 having a thickness of 0.2 micrometers and being doped with impurity of $1\times10^{19}$ $cm^{-3}$ is formed on the n-type AlGaInP current-blocking layer 7.

A pair of trenches 13 are formed on both sides of the layered structure of the n-type $In_{0.49}Ga_{0.51}P$ lower cladding layer 2, the light-emission layer 3, and the p-type $In_{0.49}Ga_{0.51}P$ first upper cladding layer 4 as illustrated in FIG. 1. The interval between the pair of trenches 13 is about 30 micrometers. The pair of trenches 13 are formed by removing predetermined portions of the p-type GaAs contact layer 8, the p-type InGaP second upper cladding layer 5, the n-type AlGaInP current-blocking layer 7, the p-type AlGaInP buried layer 6, and the n-type GaAs substrate 1 after the formation of the p-type GaAs contact layer 8 so that each of the pair of trenches 13 has a stripe shape, and extends in the direction parallel to the laser resonator formed in the semiconductor laser element.

An insulation film 9 made of $SiO_2$, SiN, a polyimide compound, or the like is formed on areas of the p-type GaAs contact layer 8 other than the area located between the pair of trenches 13. In addition, the insulation film 9 also covers the side and bottom surfaces of the pair of trenches 13. Further, a first p-side electrode 10a is formed on the area of the p-type GaAs contact layer 8 located between the pair of trenches 13, and a second p-side electrodes 10b is formed on predetermined portions of the insulation film 9. As illustrated in FIG. 1, the predetermined portions of the insulation film 9 on which the second p-side electrodes 10b is formed include portions of the insulation film 9 covering the side surfaces of the pair of trenches 13. Furthermore, an n-side electrode 11 is formed on the back surface of the n-type GaAs substrate 1.

In addition, the light-emission end facet (the forward-end facet) and the opposite end facet (the back-end facet) are each coated with a dielectric multilayer film so that the reflectances of the forward-end facet and the back-end facet are 60% and 90%, respectively. In this example, the resonator length is 250 micrometers.

In the semiconductor laser element according to the first embodiment of the present invention, the active layer is made of InGaAs, which realizes the oscillation wavelength of 0.9 to 1.2 micrometers. In addition, the active layer has a compressive-strain quantum-well structure. Therefore, the efficiency in carrier confinement is enhanced. Further, the current-blocking layer arranged on both sides of the active layer reduces leakage current. In particular, since the current-blocking layer is made of AlGaInP, the leakage current is greatly reduced.

In addition, in the semiconductor laser element according to the first embodiment of the present invention, the pair of trenches 13 are formed by removing the predetermined portions of the p-type GaAs contact layer 8, the p-type InGaP second upper cladding layer 5, the n-type AlGaInP current-blocking layer 7, the p-type AlGaInP buried layer 6, and the n-type GaAs substrate 1 so that each of the pair of trenches 13 has a stripe shape, and extends in the direction parallel to the laser resonator formed in the semiconductor laser element. Therefore, the parasitic capacitances which occur at the interfaces with the current-blocking layer can be suppressed, and thus the semiconductor laser element according to the first embodiment has satisfactory response characteristics.

Further, the semiconductor laser element according to the first embodiment has a small resonator length and high reflectances at the end facets. Therefore, the efficiency in carrier confinement is high, and the threshold current can be maintained low even in a high temperature environment. Thus, satisfactory temperature characteristics are obtained.

The present inventor has measured the current-optical output characteristic of the semiconductor laser element of FIG. 1, and the following results have been obtained. That is, at room temperature, the threshold current is 1.8 mA, and the operating current for obtaining the optical output power of 1 mW is 4.2 mA. In addition, in a high temperature environment at the temperature of 100° C., the operating current for obtaining the optical output power of 1 mW is 10 mA. The results of the measurement indicate that the optical output of the semiconductor laser element according to the first embodiment can be obtained with low driving current even in a high temperature environment at the temperature of 100° C.

Second Embodiment

Next, the semiconductor laser element according to the second embodiment of the present invention is explained below. The semiconductor laser element according to the second embodiment of the present invention is almost identical to the first embodiment except for the structure of the light-emission layer.

Figure 3:
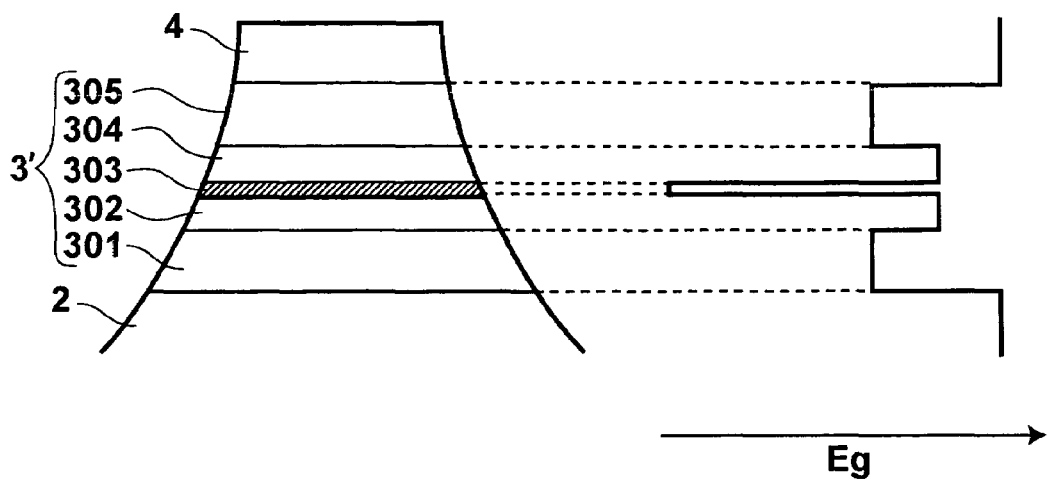
FIG. 3 is a diagram indicating details of the structure of an emission layer in the semiconductor laser element according to a second embodiment and the bandgaps in the respective layers of the emission layer.

FIG. 3 is a diagram indicating details of the structure of the measured emission layer 3' in the semiconductor laser element according to the second embodiment (in the left half of FIG. 3) and the bandgaps in the respective layers of the emission layer 3' (in the right half of FIG. 3).

According to the second embodiment, the light-emission layer 3' has a structure in which an n-type or i-type InGaAsP lower optical waveguide layer 301 having a thickness of 40 nm, an i-type GaAsP tensile-strain carrier-blocking layer 302 having a thickness of 10 nm and a bandgap Eg of 1.65 eV, an i-type $In_{0.2}Ga_{0.8}As$ compressive-strain quantum-well active layer 303 having a thickness of 7 nm, an i-type GaAsP tensile-strain carrier-blocking layer 304 having a thickness of 10 nm and a bandgap Eg of 1.65 eV, a p-type or i-type InGaAsP upper optical waveguide layer 305 having a thickness of 40 nm and a bandgap Eg of 1.6 eV are formed in this order. The strain and thickness of the i-type $In_{0.2}Ga_{0.8}As$ quantum-well active layer 303 are controlled so that the laser oscillation wavelength is 1.06 micrometers.

When the structures of FIGS. 2 and 3 are compared, the light-emission layer 3' according to the second embodiment is different from the light-emission layer 3 according to the first embodiment in that the i-type GaAsP tensile-strain carrier blocking layers 302 and 304 are inserted between the i-type $In_{0.2}Ga_{0.8}As$ quantum-well active layer 303 and the n-type or i-type InGaAsP lower optical waveguide layer 301 and between the i-type $In_{0.2}Ga_{0.8}As$ quantum-well active layer 303 and the p-type or i-type InGaAsP upper optical waveguide layer 305, respectively.

In addition, the resonator length of the semiconductor laser element according to the second embodiment is 150 micrometers, which is smaller than the resonator length of the semiconductor laser element according to the first embodiment. Further, in the semiconductor laser element according to the second embodiment, the reflectances of the forward-end facet and the back-end facet are 60% and 90%, respectively. That is, the reflectance of the forward-end facet in the semiconductor laser element according to the second embodiment is greater than the reflectance of the forward-end facet in the semiconductor laser element according to the first embodiment.

Furthermore, as illustrated in FIG. 3, the bandgaps in the i-type GaAsP tensile-strain carrier blocking layers 302 and 304 are greater than the bandgaps in the n-type or i-type InGaAsP lower optical waveguide layer 301 and the p-type or i-type InGaAsP upper optical waveguide layer 305, and smaller than the bandgaps in the n-type $In_{0.49}Ga_{0.51}P$ lower cladding layer 2 and the p-type $In_{0.49}Ga_{0.51}P$ first upper cladding layer 4. Therefore, due to the provision of the i-type GaAsP tensile-strain carrier blocking layers 302 and 304, the semiconductor laser element according to the second embodiment is superior to the first embodiment in the efficiency in carrier confinement.

The present inventor has measured the current-optical output characteristic of the semiconductor laser element according to the second embodiment, and the following results have been obtained. That is, at room temperature, the threshold current is 0.8 mA, and the operating current for obtaining the optical output power of 1 mW is 3.0 mA. In addition, in a high temperature environment at the temperature of 100° C., the threshold current is 2.5 mA, and the operating current for obtaining the optical output power of 1 mW is 8 mA. The results of the measurement indicate that the threshold current and the driving current are lowered by the provision of the GaAsP tensile-strain carrier blocking layers.

Since the threshold current of the semiconductor laser element according to the second embodiment is very small, the semiconductor laser element can be driven without applying a bias voltage. Therefore, the present inventor has measured the high-frequency response characteristics of the semiconductor laser element according to the second embodiment without applying a bias voltage, and observed a high cutoff frequency of 8 GHz. The observed cutoff frequency far exceeds the clock frequencies of the currently available CPUs. When the semiconductor laser element can be driven without applying a bias voltage, the cost of the driving circuit and power supply can be reduced. That is, the semiconductor laser element according to the second embodiment has conditions suitable for arrangement in the vicinity of an LSI.

As explained above, in the semiconductor laser elements according to the first and second embodiments, the small resonator length and high reflectances suppress the optical loss and realize operation with low threshold current. Further, the present inventor has investigated the characteristics of the semiconductor laser elements according to the present invention, and confirmed that the characteristics of the semiconductor laser elements according to the present invention are remarkably improved when the resonator length Lc of each semiconductor laser element and the reflectances Rf and Rr at the forward-end facet and the back-end facet satisfy the conditions, $$100 \text{ }\mu m \leq Lc \leq 350 \text{ }\mu m, \text{ and}$$

$$Rf \times Rr \geq 0.45.$$

Figure 4:
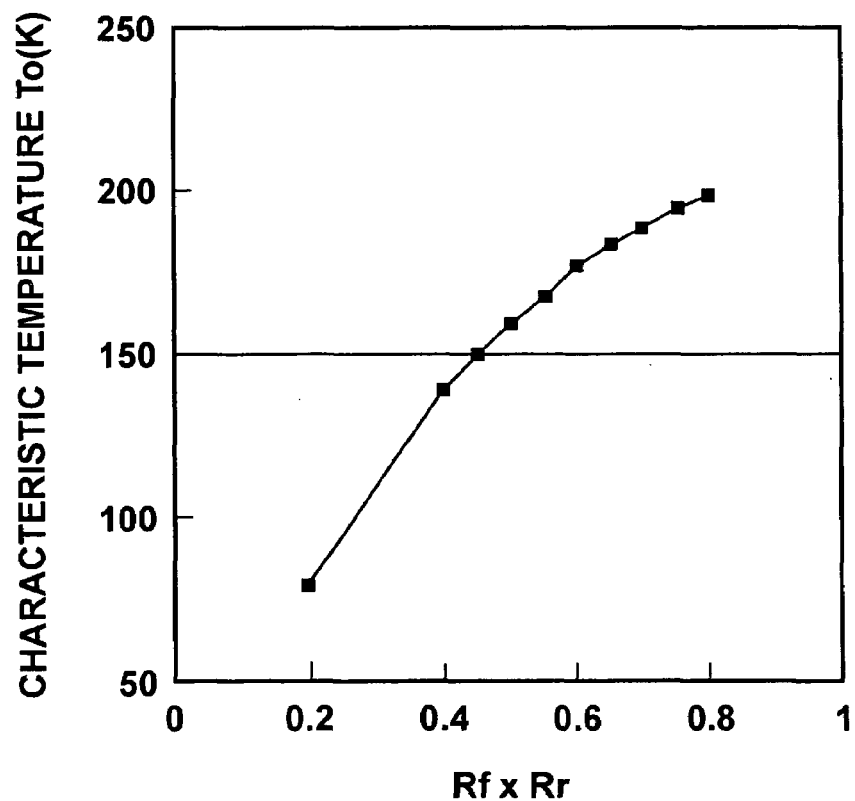
FIG. 4 is a graph indicating a relationship between the characteristic temperature and the product of the reflectances of the forward end facet and the back end facet.

FIG. 4 is a graph indicating a relationship between the characteristic temperature and the product of the reflectances of the forward end facet and the back end facet. In FIG. 4, the ordinate corresponds to the characteristic temperature, and the abscissa corresponds to the product Rf×Rr of the reflectances of the forward-end facet and the back-end facet.

As indicated in FIG. 4, the characteristic temperature increases with the product Rf×Rr. Specifically, the characteristic temperature T0 is 75 K when the product Rf×Rr is 0.2, 140 K when the product Rf×Rr is 0.4, 150 K when the product Rf×Rr is 0.45, and 200 K when the product Rf×Rr is 0.8. That is, when the product Rf×Rr is 0.45 or greater, the characteristic temperature of the semiconductor laser element becomes 150 K or higher, and such a semiconductor laser element can satisfactorily operate even in a high temperature environment at the temperature of 100° C.

Figure 5:
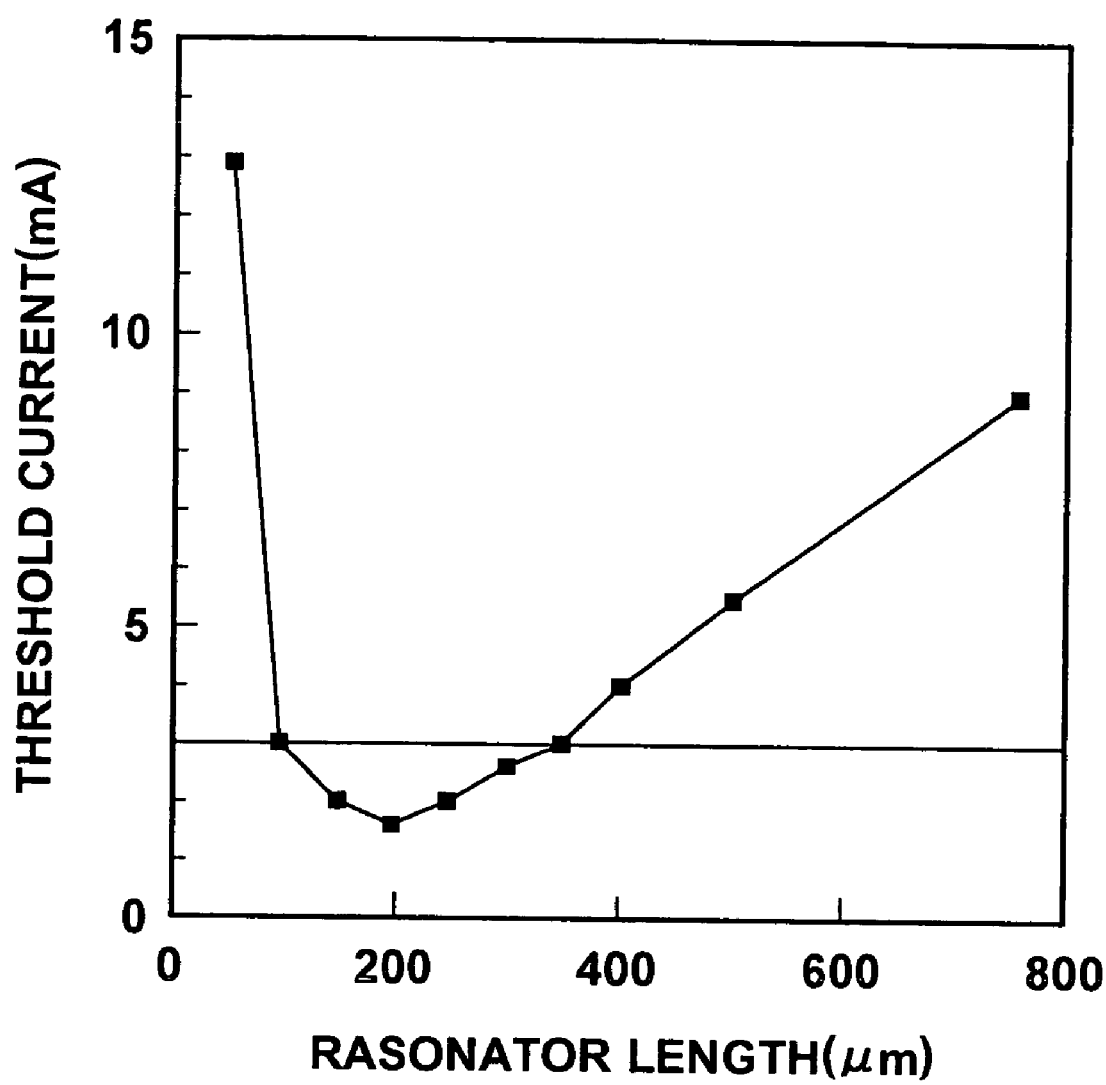
FIG. 5 is a graph indicating a relationship between the resonator length and the threshold current.

FIG. 5 is a graph indicating a relationship between the resonator length and the threshold current. In FIG. 5, the ordinate corresponds to the threshold current, and the abscissa corresponds to the resonator length.

As indicated in FIG. 5, the threshold current is about three to ten-odd milliamperes when the resonator length is smaller than 100 micrometers, and about 3 mA when the resonator length is 100 micrometers. When the resonator length is greater than 100 micrometers, the threshold current becomes smaller than 3 mA. The threshold value reaches the minimum value of about 1.5 mA when the resonator length is about 200 micrometers. When the resonator length becomes greater than 200 micrometers, the threshold current increases. The threshold current becomes about 3 mA when the resonator length is 350 micrometers. When the resonator length is greater than 350 micrometers, the threshold current further increases.

In order to operate the semiconductor laser element with low operating current and low power consumption, it is preferable that the threshold current of the semiconductor laser element is 3 mA or smaller. FIG. 4 shows that such threshold current can be realized when the resonator length is about 100 to 350 micrometers. When the threshold current is 3 mA or smaller, modulation without application of a bias voltage is enabled, and therefore it is possible to suppress the cost of circuitry and power supply for driving the semiconductor laser element, and manufacture a high-performance system at low cost by using the semiconductor laser element.

Third Embodiment

Although, according to the first and second embodiment, the parasitic capacitances which occur at the interfaces with the current-blocking layer are reduced by forming the pair of trenches 13 on both sides of the layered structure containing the light-emission layer 3 or 3', the parasitic capacitances can be reduced in other manners, for example, as explained below as the third embodiment of the present invention.

Figure 6:
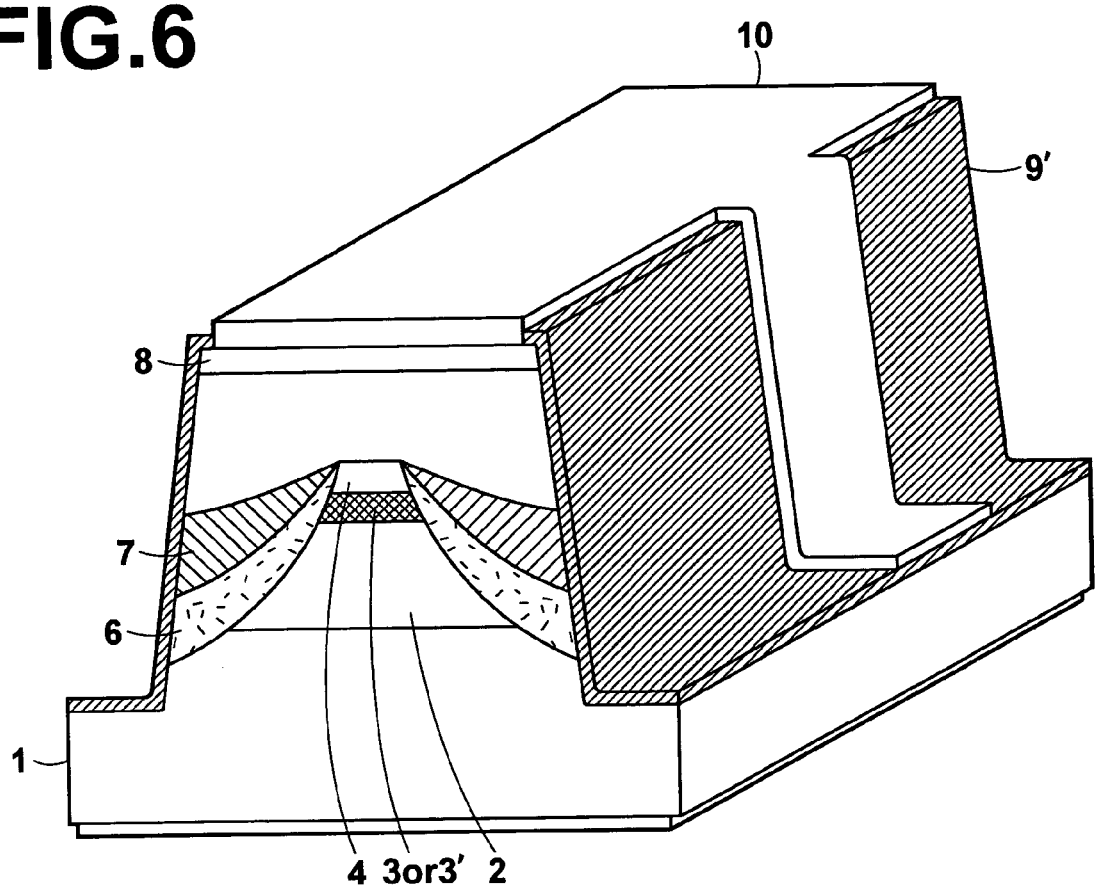
FIG. 6 is a schematic perspective view of a semiconductor laser element according to a third embodiment of the present invention.

FIG. 6 is a schematic perspective view of a semiconductor laser element according to the third embodiment of the present invention. As illustrated in FIG. 6, the n-type $In_{0.49}Ga_{0.51}P$ lower cladding layer 2, the light-emission layer 3, the p-type $In_{0.49}Ga_{0.51}P$ first upper cladding layer 4, the p-type InGaP second upper cladding layer 5, the p-type AlGaInP buried layer 6, the n-type AlGaInP current-blocking layer 7, and the p-type GaAs contact layer 8 are formed on the n-type GaAs substrate 1 in a similar manner to the first and second embodiments. However, in the third embodiment, instead of forming the pair of trenches 13, predetermined side portions of the above layers except for the lower portion of the n-type GaAs substrate 1 are removed as illustrated in FIG. 6. In other words, only the lower portion of the n-type GaAs substrate 1 and central stripe portions of the respective layers and the upper portion of the n-type GaAs substrate 1 are remained, and the other portions are removed.

In addition, an insulation film 9' is formed on the side surfaces of the above layers which are exposed by the removal. Further, a p-side electrode 10 is formed on the p-type GaAs contact layer 8 and portions of the insulation film 9'. That is, the p-side electrode 10 is constituted by a first portion formed on the p-type GaAs contact layer 8 and a second portion formed on the portions of the insulation film 9', where the second portion is extended outward from the first portion and has a stripe shape. Thus, the parasitic capacitances which occur at the interfaces with the current-blocking layer 7 can be suppressed.

Fourth Embodiment

Figure 7:
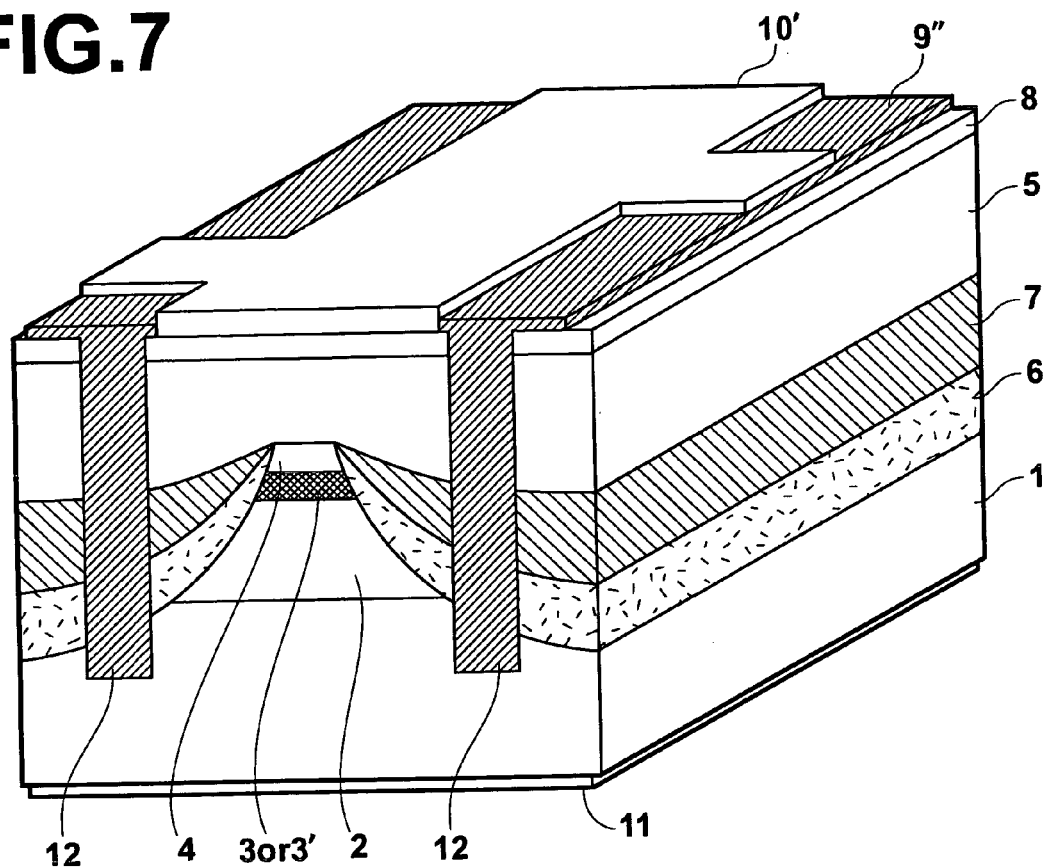
FIG. 7 is a schematic perspective view of a semiconductor laser element according to a fourth embodiment of the present invention.

FIG. 7 is a schematic perspective view of a semiconductor laser element according to the fourth embodiment of the present invention. The semiconductor laser element according to the fourth embodiment is identical to the first embodiment except that the pair of trenches 13 are filled with the same material 9" as the insulation film 9 in the first embodiment, instead of forming the insulation film 9 on the surfaces of the pair of trenches 13, so that a pair of insulation layers 12 are formed through the p-type GaAs contact layer 8, the p-type InGaP second upper cladding layer 5, the n-type AlGaInP current-blocking layer 7, and the p-type AlGaInP buried layer 6 and reach the n-type GaAs substrate 1. In this structure, a p-side electrode 10' is formed on only the upper surface of the semiconductor laser element, and the parasitic capacitances which occur at the interfaces with the current-blocking layer 7 can be suppressed.

Variations and Additional Matters (i) The compositions of the semiconductor layers formed on the GaAs substrate which are indicated in the above descriptions are merely examples which make the layers lattice-match with GaAs, and the present invention is not limited to the indicated compositions.

(ii) It is possible to invert the conductivity types of all of the layers constituting the structure according to each embodiment. The semiconductor laser element formed of the layers having the inverted conductivity types also has similar advantages to the embodiment described above, and is also within the scope of the present invention.

What is claimed is:

1. A substrate made of GaAs; a lower optical waveguide formed above a lower cladding layer that being formed above said substrate having a stripe shape with a width smaller than a width which the substrate and made of a material of a first conductive type, where at least one compressive-strain quantum-well active layer being formed above said lower optical waveguide layer and made of InGaAs, and having a stripe shape with a width smaller than said substrate width; an upper cladding layer formed above an upper optical waveguide layer being formed above compressive-strain quantum-well active layer and made of a second conductive type, and having a stripe shape with a width smaller than said substrate width; a current-blocking layer formed on both sides of compressive-strain quantum-well active layer so that the at least one compressive-strain quantum-well active layer is sandwiched between two portions of the current-blocking layer; and trenches being formed through said current-blocking layer and extending along a direction of a laser resonator formed in said semiconductor laser element.

2. A semiconductor laser element according to claim 1, further comprising at least one insulation layer which covers surfaces of said trenches.

3. A semiconductor laser element according to claim 1, further comprising, a lower carrier-confinement layer formed between said lower optical waveguide layer and said at least one compressive-strain quantum-well active layer, and an upper carrier-confinement layer formed between said upper optical waveguide layer and said at least one compressive-strain quantum-well active layer;

wherein each of said lower carrier-confinement layer and said upper carrier-confinement layer is made of a material which has a bandgap greater than a bandgap which each of said lower optical waveguide layer and said upper optical waveguide layer has, and smaller than a bandgap which each of said lower cladding layer and said upper cladding layer has.

4. A semiconductor laser element according to claim 1, wherein said current-blocking layer comprises,
   a first layer formed adjacent to said at least one compressive-strain quantum-well active layer, and made of $(Al_xGa_{1-x})_{0.5}In_{0.5}P$ of said second conductive type, where $0 \leq x \leq 1$, and
   a second layer formed above said first layer, and made of $(Al_xGa_{1-x})_{0.5}In_{0.5}P$ of said first conductive type, where $0 \leq x \leq 1$.

5. A semiconductor laser element according to claim 1, further comprising,
   a first multilayer film formed of a dielectric material so as to cover a first end facet of said semiconductor laser element through which laser light is emitted, and realize a first reflectance Rf at the first end facet, and
   a second multilayer film formed of a dielectric material so as to cover a second end facet of said semiconductor laser element opposite to said first end facet, and realize a second reflectance Rr at the second end facet,
   wherein said semiconductor laser element has a resonator length Lc, and the resonator length Lc and the first and second reflectances Rf and Rr satisfy conditions, $100~\mu m \leq Lc \leq 350~\mu m$, and $Rf \times Rr \geq 0.45$.

6. A stripe shape ridge structure being arranged on a GaAS substrate extending along a direction of a laser resonator formed in said semiconductor laser element, where a lower optical waveguide layer formed above a lower cladding layer that formed above said substrate and made of a material of said first conductive type, at least one compressive-strain quantum-well active layer being formed above said lower optical waveguide layer and made of InGaAs, an upper cladding layer being formed above an upper optical waveguide layer that formed above said compressive-strain quantum-well active layer and made of a material of a second conductive type, where the lower and upper optical waveguide and compressive quantum-well having a stripe shape with a width smaller than said ridge-structure's width, and a current-blocking layer formed on both sides of said at least one compressive-strain quantum-well active layer so that the at least one compressive-strain quantum-well active layer is sandwiched between two portions of the current-blocking layer.

7. A semiconductor laser element according to claim 6, further comprising at least one insulation layer which covers side surfaces of said ridge structure.

8. A semiconductor laser element according to claim 6, further comprising,
   a lower carrier-confinement layer formed between said lower optical waveguide layer and said at least one compressive-strain quantum-well active layer, and
   an upper carrier-confinement layer formed between said upper optical waveguide layer and said at least one compressive-strain quantum-well active layer;
   wherein each of said lower carrier-confinement layer and said upper carrier-confinement layer is made of a material which has a bandgap greater than a bandgap which each of said lower optical waveguide layer and said upper optical waveguide layer has, and smaller than a bandgap which each of said lower cladding layer and said upper cladding layer has.

9. A semiconductor laser element according to claim 6, wherein said current-blocking layer comprises,
   a first layer formed adjacent to said at least one compressive-strain quantum-well active layer, and made of $(Al_xGa_{1-x})_{0.5}In_{0.5}P$ of said second conductive type, where $0 \leq x \leq 1$, and
   a second layer formed above said first layer, and made of $(Al_xGa_{1-x})_{0.5}In_{0.5}P$ of said first conductive type, where $0 \leq x \leq 1$.

10. A semiconductor laser element according to claim 6, further comprising,
    a first multilayer film formed of a dielectric material so as to cover a first end facet of said semiconductor laser element through which laser light is emitted, and realize a first reflectance Rf at the first end facet, and
    a second multilayer film formed of a dielectric material so as to cover a second end facet of said semiconductor laser element opposite to said first end facet, and realize a second reflectance Rr at the second end facet,
    wherein said semiconductor laser element has a resonator length Lc, and the resonator length Lc and the first and second reflectances Rf and Rr satisfy conditions, $100~\mu m \leq Lc \leq 350~\mu m$, and $Rf \times Rr \geq 0.45$.

* * * * *